United States Patent [19]

Rille et al.

[11] Patent Number: 4,747,927

[45] Date of Patent: * May 31, 1988

[54] TARGET PLATE FOR CATHODE DISINTEGRATION

[75] Inventors: Eduard Rille, Dornbirn, Austria; Bernhard Bracher, Balzers, Liechtenstein; Robert Polacek, Buchs, Switzerland

[73] Assignee: Balzers Aktiengesellschaft, Liechtenstein

[*] Notice: The portion of the term of this patent subsequent to May 26, 2004 has been disclaimed.

[21] Appl. No.: 883,542

[22] Filed: Jul. 9, 1986

[30] Foreign Application Priority Data

Jul. 10, 1985 [CH] Switzerland ............... 02986/85

[51] Int. Cl.[4] ........................................... C23C 14/34
[52] U.S. Cl. .................................. 204/298; 204/192.1
[58] Field of Search ............... 204/298, 297 R, 192.1; 269/47; 118/500

[56] References Cited

U.S. PATENT DOCUMENTS

| 3,838,031 | 9/1974 | Snaper ..................... 204/298 X |
| 4,414,086 | 11/1983 | Lamont, Jr. ............. 204/298 X |
| 4,421,628 | 12/1983 | Quaderer ................... 204/298 |
| 4,428,816 | 1/1984 | Class et al. ................ 204/298 |
| 4,448,652 | 5/1984 | Pachonik ................... 204/298 |
| 4,485,000 | 11/1984 | Kawaguchi et al. ....... 204/298 |
| 4,515,675 | 5/1985 | Kieser et al. .............. 204/298 |
| 4,517,070 | 5/1985 | Kisner ........................ 204/298 |

Primary Examiner—John F. Niebling
Assistant Examiner—Nam X. Nguyen
Attorney, Agent, or Firm—McGlew and Tuttle

[57] ABSTRACT

Cathode disintegration targets which during sputtering are exposed to a very high thermal load have heretofore been pressed against a cooling support from the side to be sputtered by means of bars and screws, to cool them. According to invention it is proposed to make the target plate in several parts and to provide on the sides where the individual parts abut mutually correlated cutouts, pairs of which form a cavity into which an auxiliary element, preferably a plate with threaded bores, can be inserted for attachment from the cooling support side.

5 Claims, 1 Drawing Sheet 4,747,927

TARGET PLATE FOR CATHODE DISINTEGRATION

FIELD AND BACKGROUND OF THE INVENTION

This invention relates in general to apparatus for coating substrates such as by sputtering and in particular to a new and useful target plate for cathode disintegration.

Target plates for cathode disintegration comprise the material which is to be sputtered in a cathode sputtering installation in order to precipitate on substrate surfaces a layer of the respective material, or in the presence of a chemically active residual gas in the sputtering installation, they comprise a chemical compound of target material with the active gas.

In installations of greater output, the cathode plates are often exposed to a very high thermal load due to the bombardment with ions and must be cooled to remove the excess thermal energy. Nevertheless, at high outputs the problem arises that when, as usual, the target plates are pressed, rigidly clamped at their edge, against a cooled support, they warp due to thermal expansions and then lift off the support, owing to which the cooling becomes insufficient and the target material assumes too high a temperature. It will then soften and may even ultimately melt. To prevent this, it has been tried before to solder or weld the target plate on its backside to the cooled support, but such a union had to be made with extreme care, as otherwise the target plate could detach from the support. Nevertheless, this soldering on or welding is costly.

Usually the target plate was screwed at its circumference on the cooled support and also in the middle of the plate a screw attachment was provided, to prevent lifting off. From U.S. Pat. No. 4,421,628 a target plate is known which along a parallel center line of the surface to be sputtered has several cutouts for attachment, these being arranged in the bottom of a groove disposed on the side of the surface to be sputtered along the center line and the groove for the attachment of the target plate and the respective attachment screws do not protrude over the sputter plane. Owing to the small thickness of the target plate in the region of the groove bottom in the center of the plate, where in former arrangements usually the highest temperature occurred during the sputtering, an improved cooling was achieved at this point, thereby preventing that the material could warp or flow in the region of the center attachment. The need for an attachment bar on the front side of the target plate, that is, on the surface to be sputtered, still constitutes a disadvantage, however, especially when even the least co-sputtering of the material (steel), of which the central attachment bar and the attachment screws were made, impermissibly contaminates the layers to be produced.

To avoid this, there has been proposed by the Applicant already a target plate which on its side away from the surface to be sputtered has at least one cutout in which by means of a positive spring union an auxiliary element for attachment to a support is inserted. Said cutout may have e.g. the form of a hollow cylinder, a cylindrical auxiliary element being inserted in the cutout by means of a lock ring. To obtain sufficient mechanical stability also at higher operating temperatures, the auxiliary element should consist of a material which has a much higher softening point than the material to be sputtered.

SUMMARY OF THE INVENTION

The present invention provides a still better possibility for attaching a target plate at its back.

By making the target plate in several parts, the advantage is obtained in operation that the individual plate parts can be replaced or interchanged depending on their wear, so that all parts can be subjected to a more or less uniform erosion. As target materials are often very expensive, this possibility is of special economic significance. The multi-part design of targets for cathode disintegration and the described exchanging of individual plate parts to obtain a better degree of utilization is indeed known from DT-OS 30 09 836, but it had not been realized that such a multi-part cathode offers an extremely simple and appropriate possibility to securely attach the cathode at its back, as described in the present application.

Accordingly it is an object of the invention to provide a target plate for cathode disintegration which during operation is pressed in a position with its rear side or back facing away from the surface to be sputtered against the support which includes a target plate having a plurality of parts each being provided with a cutout which is preferably contiguous to the next adjacent part cutout which is positioned an auxiliary fastening element for attaching the parts together and to a support.

Further object of the invention is to provide a target plate which is simple in design, rugged in construction and economical to manufacture.

Standard clause has more than one embodiment.

GENERAL DESCRIPTION OF THE PREFERRED EMBODIMENTS

Figure 1:
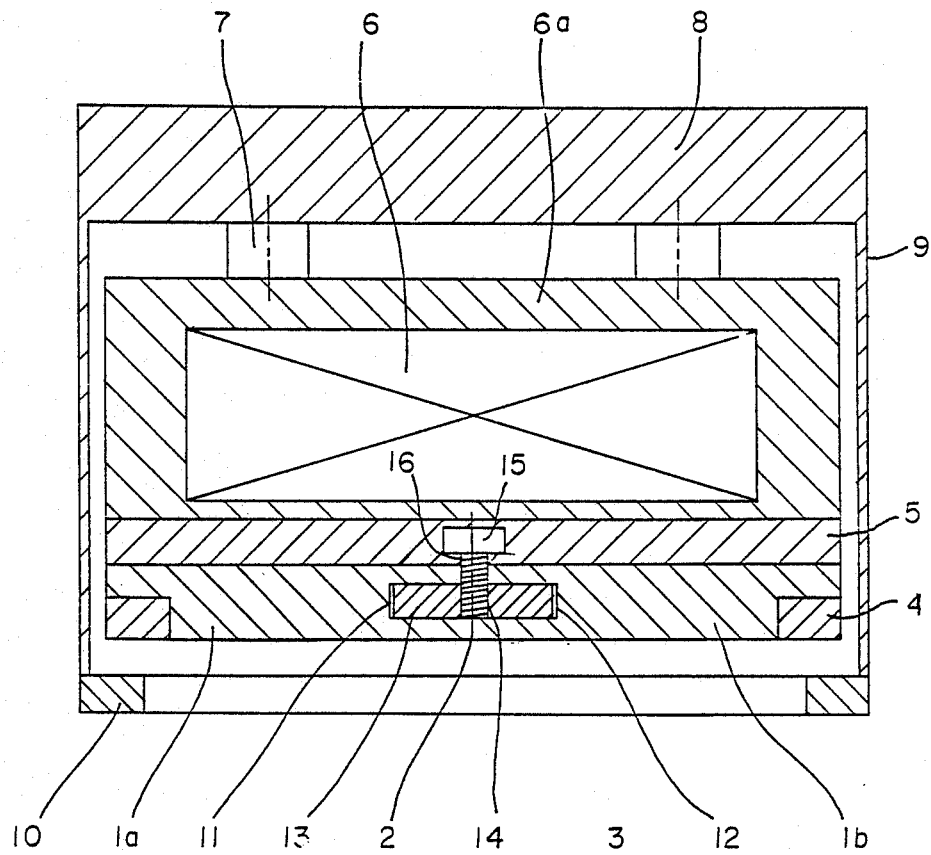
FIG. 1 shows a longitudinal sectional view through a multi-part target plate, as well as the arrangement thereof in a magnetron sputtering apparatus in accordance with the invention.

Referring to the drawings in particular the invention embodied therein in FIG. 1 comprises a target plate (1) for cathode disintegration which during operation is pressed or held with its rear or backside away from the surface which is to be sputtered. In accordance with the invention the target plate is made up of a plurality of parts each of which has a cutout or similar means for securing the parts together and for holding them to a support.

In FIG. 1 a target plate comprises two parts 1a and 1b, which abut at a central joint 2, so that electrically speaking a single target is formed, a front side 3 of which is to be sputtered. By a clamping ring 4 engaging at its circumference, the plate 1 is screwed against a cooling plate 5 (which is cooled by cooling systems not shown, e.g. ducts traversed by cooling medium). The target plate 1 and cooling plate 5 in turn apply against a (symbolically drawn) electromagnet 6, which in known manner during operation maintains on the front side of the target plate to be sputtered a magnetic field which brings it about that the charge carries of a simultaneously operated electrical gas discharge are concentrated in front of the target surface to be sputtered, whereby, as is known the efficiency of the sputtering can be greatly increased. The magnet 6 is carried by the props 7 which rest on a bottom or end 8 of the housing 9, which in turn receives the entire arrangement. 10 is an aperture ring at the upper end of the housing, which suitably limits the aperture angle of the stream of sputtered particles and which also serves as anode for the electric gas discharge which must be maintained between an anode and the cathode plate (target plate).

Now to be able to grip the two parts 1a and 1b of the target plate on the cooling support not only at the edge by means of the clamping ring 4 but also in the center, said parts have on the joint-forming sides each a cutout 11, 12, which together form a cavity in which the auxiliary element 13 is insertable. The auxiliary element 13 has in turn a threaded bore 14 for attachment of the target plate on the cooling support. This attachment can best be effected with a screw 15 which, reaching through bore 16 of the cooling plate, presses the auxiliary element 13 and hence the two parts 1a and 1b of the target plate against the cooling support. The arrangement shown permits especially simple handling when changing the target plate or disassembling the sputtering apparatus for cleaning or repair. After detaching the clamping ring 4 and the cooling support from the magnet housing 6a, it then suffices to unscrew screw 15 to be able to remove and replace the individual parts.

Figure 2:
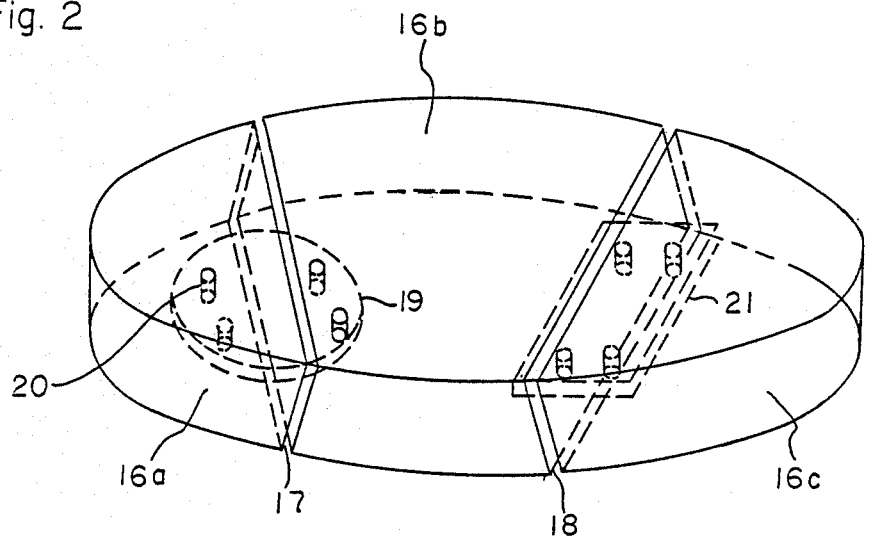
FIG. 2 shows a top and side perspective view of a multi-part target plate constructed in accordance with the invention.

The embodiment example of an oval three-part target plate shown in FIG. 2 consists of the parts 16a, 16b and 16c. The three parts are drawn in FIG. 2 with a small distance between them, to make visible both joints 17 and 18; in use, however, the three parts are closely fitted together (as shown for the parts 1a and 1b in FIG. 1). The abutting, joint-forming surfaces are again provided with cutouts according to the invention, so that they form corresponding cavities for receiving the auxiliary attachment elements or plates 18 and 21. At (in FIG. 2) the left joint the two parts 16a and 16b have cutouts of a form such that a circular plate 19 as auxiliary element can be placed into the cavity formed by the cutouts, there being provided four threaded bores 20 for attachment from the cooling support side, whereby the auxiliary element is secured also against rotation when screwing in the attachment screws. The limiting surfaces of the right joint, on the other hand, are equipped with cutouts which can receive an auxiliary element in the form of a rectangular plate 21, and again four bores serv for attachment from the underside.

As the specialist will see, it is thus readily possible to give the cutouts different forms, taking into consideration, of course, that the auxiliary element 13 is not to be rotatable in the cavity formed by the cutouts, to make possible the tightening of the screws 15. To this end the cutouts and the auxiliary element 19 and 21 are appropriately formed so that each element finds room in the cavity formed by the cutouts for positive engagement. The auxiliary elements consists advantageously of a material of good thermal conductivity, e.g. copper.

What is claimed is:

1. A target plate assembly for cathode disintegration, comprising at least two target plate parts oriented adjacent each other at a joint, said parts together forming a target plate having a front surface to be sputtered and a rear surface for engagement against a support plate, each of said parts having a cutout portion communicating with said joint and with each other, an auxiliary element substantially filling the said cutouts and spanning said joint, and means for holding said element to said support plate for anchoring said parts against said support plate, said cutouts being spaced away from said front surface and at least one of said cutouts extending through rear surface for passage of said means for holding said element to said support plate.

2. A target plate according to claim 1 wherein said means for holding said element to said support plate comprises a threaded screw member, said auxiliary element comprising a plate fitting in the cutout.

3. A target plate according to claim 2 wherein said support plate comprises a plate having cooling means.

4. A target plate according to claim 3 wherein said auxiliary element comprises a material which has a substantially higher softening point than the material to be sputtered.

5. A target plate according to claim 1 wherein said auxiliary element comprises a plate with a threaded bore.

* * * * *